(12) United States Patent
Ju

(10) Patent No.: US 6,476,446 B2
(45) Date of Patent: Nov. 5, 2002

(54) HEAT REMOVAL BY REMOVAL OF BURIED OXIDE IN ISOLATION AREAS

(75) Inventor: Dong-Hyuk Ju, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/477,067

(22) Filed: Jan. 3, 2000

(65) Prior Publication Data

US 2002/0008283 A1 Jan. 24, 2002

(51) Int. Cl.$^7$ .......................... H01L 27/01; H01L 27/12
(52) U.S. Cl. ........................ 257/347; 257/350
(58) Field of Search .................. 257/347, 348, 257/349, 350, 351, 352, 353, 354, 507; 438/149, 479, 517, 152, 153, 154, 155, 156, 164, 282, 298, 309, 311, 412, 910

(56) References Cited

U.S. PATENT DOCUMENTS

| | | | |
|---|---|---|---|
| 4,975,126 A | 12/1990 | Margail et al. | 145/33.2 |
| 5,488,004 A | 1/1996 | Yang | 437/35 |
| 5,665,613 A | 9/1997 | Nakashima et al. | 438/151 |
| 5,707,899 A | 1/1998 | Cerofolini et al. | 438/407 |
| 5,741,717 A | 4/1998 | Nakai et al. | 437/24 |
| 5,759,907 A | 6/1998 | Assaderaghi et al. | 438/386 |
| 5,855,693 A | 1/1999 | Murari et al. | 148/33.3 |
| 5,891,265 A | 4/1999 | Nakai et al. | 148/33.3 |
| 5,918,136 A | 6/1999 | Nakashima et al. | 438/404 |
| 6,133,610 A * | 10/2000 | Bolam et al. | 257/349 |
| 6,232,649 B1 * | 5/2001 | Lee | 257/588 |

FOREIGN PATENT DOCUMENTS

JP 4343265 * 11/1992

* cited by examiner

Primary Examiner—Tom Thomas
Assistant Examiner—Hung Kim Vu
(74) Attorney, Agent, or Firm—Amin & Turocy, LLP

(57) ABSTRACT

In one embodiment, the present invention relates to a method of forming a Silicon-on-Insulator substrate involving providing a structure comprising a bulk silicon layer, a buried insulation layer over the bulk silicon layer, a silicon device layer over the buried insulation layer, and a mask layer over the silicon device layer; etching portions of the mask layer, the silicon device layer, and the buried insulation layer thereby forming openings and exposing portions of the bulk silicon layer; depositing polysilicon in the openings; removing a portion of the polysilicon in the openings to form polysilicon sidewalls adjacent the silicon device layer and the buried insulation layer and to form gaps at least partially surrounded by the polysilicon sidewalls; depositing an insulation material in the gaps; and removing the mask layer. In another embodiment, the present invention relates to a Silicon-on-Insulator substrate made of a bulk silicon layer, a buried insulation layer over the bulk silicon layer, a silicon device layer over the buried insulation layer; a plurality of at least one of holes and trenches in the silicon device layer and the buried insulation layer, wherein the plurality of at least one of holes and trenches contains a polysilicon sidewall adjacent the bulk silicon layer, the buried insulation layer, and the silicon device layer, the polysilicon sidewall surrounding an insulating material, the insulating material in contact with the bulk silicon layer.

6 Claims, 2 Drawing Sheets

HEAT REMOVAL BY REMOVAL OF BURIED OXIDE IN ISOLATION AREAS

TECHNICAL FIELD

The present invention generally relates to improved Silicon-on-Insulator devices. More particularly, the present invention relates to methods for removing heat from Silicone-Insulator devices and devices having such characteristics.

BACKGROUND ART

Silicon-on-Insulator (SOI) technology is of growing importance in the field of integrated circuits. SOI technology involves forming transistors in a relatively thin layer of semiconductor material overlying a layer of insulating material. More particularly, SOI technology is characterized by the formation of a thin silicon layer (device region) for formation of the active devices over an insulating layer, such as an oxide, which is in turn formed over a substrate. Transistor sources and drains are formed, for example, by implantations into the silicon layer while transistor gates are formed by forming a patterned oxide and conductor layer structure.

Such structures provide a significant gain in performance by having lower parasitic capacitance (due to the insulator layer) and increased drain current due to floating body charging effects (since no connection is made to the channel region and charging of the floating body provides access towards a majority of carriers which dynamically lower the threshold voltage, resulting in increased drain current). Devices, such as metal oxide silicon field effect transistors (MOSFET), have a number of advantages when formed on SOI wafers versus bulk silicon MOS transistors. These advantages include: reduced source/drain capacitance and hence improved speed performance at higher-operating frequencies; reduced $N^+$ to $P^+$ spacing and hence higher packing density due to ease of isolation; absence of latchup; lower voltage applications; and higher "soft error" upset immunity (i.e., the immunity to the effects of alpha particle strikes).

Although there are significant advantages associated with SOI technology, there are significant disadvantages as well. For example, poor heat removal from devices on an SOI substrate is a significant disadvantage. Electrical devices generate heat, and the inability to remove or dissipate the heat results in poor and/or inconsistent performance of the electrical devices, or even in some instances device and/or substrate degradation.

There is poor heat removal for devices on SOI substrates primarily because of the oxide insulation layer. More specifically, the oxide insulation layer has a markedly lower thermal conductivity than the thermal conductivity of conventional bulk silicon (typically used as semiconductor substrates), which typically surrounds semiconductor devices. As a result, the buried oxide layer undesirably insulates thermally the device region in SOI substrates. This problem is in some instances compounded when shallow trench isolation areas are formed within an SOI substrate. Nevertheless, shallow trench isolation areas offer desirable characteristics to semiconductor substrates containing such regions.

In view of the aforementioned disadvantages, there is a need for SOI devices of improved quality, particularly SOI devices having improved heat removal characteristics, and more efficient methods of making such SOI devices.

SUMMARY OF THE INVENTION

As a result of the present invention, an SOI substrate having improved heat removal characteristics (from the device layer) is provided. By forming an SOI substrate according to the present invention, improved performance of devices subsequently formed on the SOI substrate is facilitated. Moreover, forming an SOI substrate in accordance with the present invention does not degrade or deleteriously effect the advantageous properties and characteristics commonly associated with SOI technology (improved speed performance at higher-operating frequencies, higher packing density, absence of latch-up, lower voltage applications, and higher "soft error" upset immunity). The SOI substrates in accordance with certain embodiments of the present invention also have desirable characteristics commonly associated with shallow trench isolation areas.

In one embodiment, the present invention relates to a method of forming an SOI substrate involving providing a structure comprising a bulk silicon layer, a buried insulation layer over the bulk silicon layer, a silicon device layer over the buried insulation layer, and a mask layer over the silicon device layer; etching portions of the mask layer, the silicon device layer, and the buried insulation layer thereby forming openings and exposing portions of the bulk silicon layer; depositing polysilicon in the openings; removing a portion of the polysilicon in the openings to form polysilicon sidewalls adjacent the silicon device layer and the buried insulation layer and to form gaps at least partially surrounded by the polysilicon sidewalls; depositing an insulation material in the gaps; and removing the mask layer.

In another embodiment, the present invention relates to a method of increasing heat removal in an SOI substrate, involving providing a structure comprising a bulk silicon layer, a buried silicon dioxide layer over the bulk silicon layer, a silicon device layer over the buried silicon dioxide layer, and a mask layer over the silicon device layer; anisotropically etching portions of the mask layer, the silicon device layer, and the buried silicon dioxide layer thereby forming openings and exposing portions of the bulk silicon layer; depositing polysilicon in the openings over the bulk silicon layer; removing a portion of the polysilicon in the openings to form polysilicon sidewalls adjacent the silicon device layer and the buried silicon dioxide layer and in contact with the bulk silicon layer, wherein the remaining portion of the polysilicon in the openings forms gaps; depositing an insulation material in the gaps; and removing the mask layer.

In yet another embodiment, the present invention relates to an SOI substrate made of a bulk silicon layer, a buried insulation layer over the bulk silicon layer, a silicon device layer over the buried insulation layer; a plurality of at least one of holes and trenches in the silicon device layer and the buried insulation layer, wherein the plurality of at least one of holes and trenches contains a polysilicon sidewall adjacent the bulk silicon layer, the buried insulation layer, and the silicon device layer, the polysilicon sidewall surrounding an insulating material, the insulating material in contact with the bulk silicon layer.

DISCLOSURE OF INVENTION

By forming an SOI substrate having improved heat removal characteristics, the performance of devices subsequently formed on the SOI substrate can be substantially improved. While not wishing to be bound to any theory, it is believed that by forming isolation areas according to the present invention, it is consequently possible to increase the amount of heat that may be removed (and/or increase the rate at which heat may be removed) from the device layer of the SOI substrate by dissipating the heat through the polysilicon sidewalls. Improving the removal of heat from the device layer consequently improves the performance and increases the life of devices, such as MOSFETs, formed on the device layer of the SOI substrate.

The present invention involves positioning polysilicon sidewalls adjacent portions of the silicon device layer and vertically corresponding portions of the buried insulation layer of an SOI substrate. Gaps between polysilicon sidewalls are filled with an insulating material. In the completed SOI substrate, the polysilicon sidewalls act as a heat dissipaters. The polysilicon sidewalls have a relatively high thermal conductivity and thus facilitate the transfer of heat away from (and preventing the local build-up of) heat generated in the device layer of the SOI substrate. Polysilicon or polycrystalline silicon has a thermal conductivity (approximately from about 75 to about 125 W/m° K) that is higher than the thermal conductivity of silicon dioxide (about 1.4 W/m° K).

The polysilicon sidewalls, as its name implies, contains polysilicon and forms a stable structure that adheres well to bulk silicon and insulator materials (such as silicon dioxide). The thermal conductivity of the polysilicon sidewalls is relatively high compared to the thermal conductivity of the insulation layer. In one embodiment, the thermal conductivity of the polysilicon sidewalls is at least about 40 times higher than the thermal conductivity of the buried insulation layer. In another embodiment, the thermal conductivity of the polysilicon sidewalls is at least 50 times higher than the thermal conductivity of the buried insulation layer. In yet another embodiment, the thermal conductivity of the polysilicon sidewalls is at least 60 times higher than the thermal conductivity of the buried insulation layer.

Figure 1:
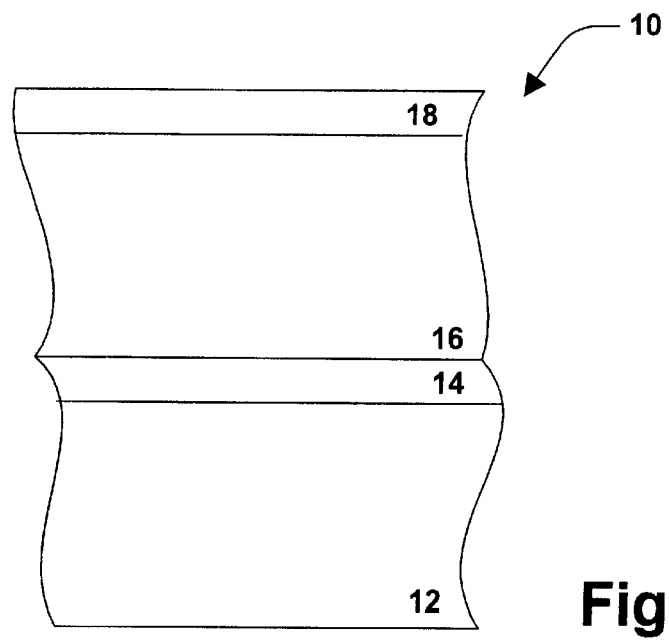
FIG. 1 is a cross-sectional view of one aspect of making an SOI substrate in accordance with one embodiment of the present invention.

Referring to the Figures, the present invention is discussed in greater detail (the figures are not drawn to scale). Initially, referring to FIG. 1, an SOI structure 10 is provided. The SOI structure 10 has a bulk or monocrystalline silicon layer 12, a buried insulation layer 14 over the bulk silicon layer 12, and a silicon layer (device layer) 16 over the buried insulation layer 14. The SOI structure 10 is made using any suitable technique including dielectric isolation, wafer bonding and etchback, separation by implanted oxygen (SIMOX), zone melting recrystallization, full isolation by porous oxidized silicon, and selective oxidation with selective epitaxial growth. SIMOX and wafer bonding and etchback techniques are preferred.

The buried insulation layer 14 typically contains silicon dioxide, although the insulation layer may contain any suitable insulating or oxide material. The buried insulation layer 14 has thickness from about 100 Å to about 5,000 Å. In another embodiment, the buried insulation layer 14 has thickness from about 1,000 Å to about 4,000 Å. In another embodiment, the buried insulation layer 14 has thickness from about 2,000 Å to about 3,500 Å. The device layer 16 has thickness from about 500 Å to about 5,000 Å. In another embodiment, the device layer 16 has thickness from about 1,000 Å to about 3,000 Å.

An isolation area mask layer 18 is formed over the device layer 16. The isolation are mask layer 18 has a thickness suitable for protecting regions of the device layer 16 during subsequently described etching steps and polysilicon sidewall formation steps. The isolation area mask layer 18 has thickness from about 100 Å to about 4,000 Å. In another embodiment, the isolation area mask layer 18 has thickness from about 500 Å to about 3,000 Å. The isolation area mask layer 18 is formed of any suitable masking material including silicon nitride, silicon dioxide, and silicon oxynitride. The isolation area mask layer 18 serves to protect the silicon device layer 16 during subsequently described etching of the polysilicon and/or during subsequently described polishing techniques.

Figure 2:
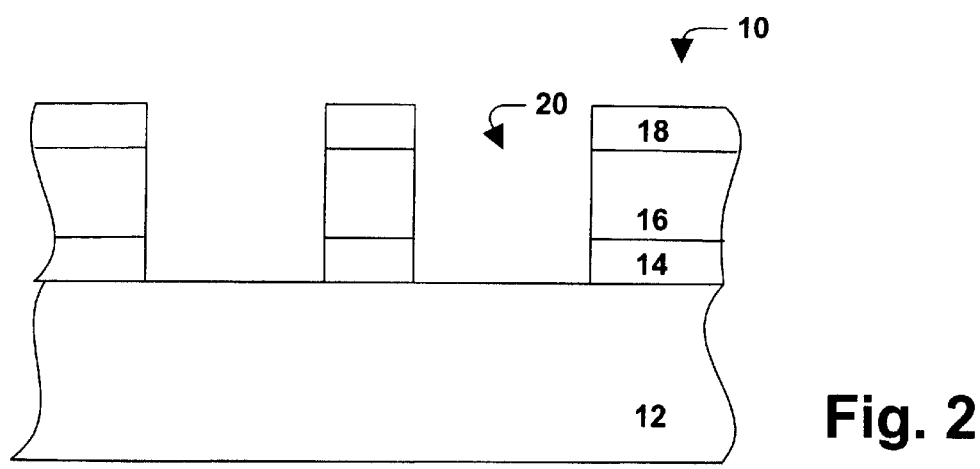
FIG. 2 is a cross-sectional view of another aspect of making an SOI substrate in accordance with one embodiment of the present invention. a FIG. 3 is a cross-sectional view of another aspect of making an SOI substrate in accordance with one embodiment of the present invention.

Referring to FIG. 2, portions of the buried insulation layer 14, the device layer 16 and the isolation area mask layer 18 of the SOI structure 10 are etched using suitable lithography techniques to form openings 20 exposing portions of the bulk silicon layer 12. A portion of the bulk silicon layer 12 in openings 20 may be removed, but this is not typically necessary. Although not shown, a resist is deposited, selectively irradiated, and developed, exposing portions of the isolation area mask layer 18 corresponding to openings 20. Then, suitable etch steps are performed, preferably in an anisotropic manner, to sequentially remove the isolation area mask layer 18, the device layer 16 and the buried insulation layer 14.

The openings 20 may be in the form of any shape, but typically openings 20 are cylindrical, conical, or trench-like. In embodiments where the openings 20 are trench-like, isolation regions are formed in the result SOI substrate. In one embodiment, the size (diameter in the case of a cylindrical opening or width in the case of a trench-like opening) of openings 20 is from about 500 Å to about 10,000 Å. In another embodiment, the size of openings 20 is from about 1,000 Å to about 7,500 Å. In yet another embodiment, the size of openings 20 is from about 1,500 Å to about 5,000 Å. Each opening 20 on a given structure maybe the same or different in size and/or shape.

A sufficient number of openings 20 are formed on the SOI structure 10 to minimize heat build-up during subsequent operation and/or maximize heat removal from the silicon device layer 16 during subsequent operation. More openings 20 are formed when openings in the form of cylinders are made versus making trenches. The space between any given two openings can vary greatly, for example, from about 2,000 Å to about 5 $\mu$m.

Figure 3:
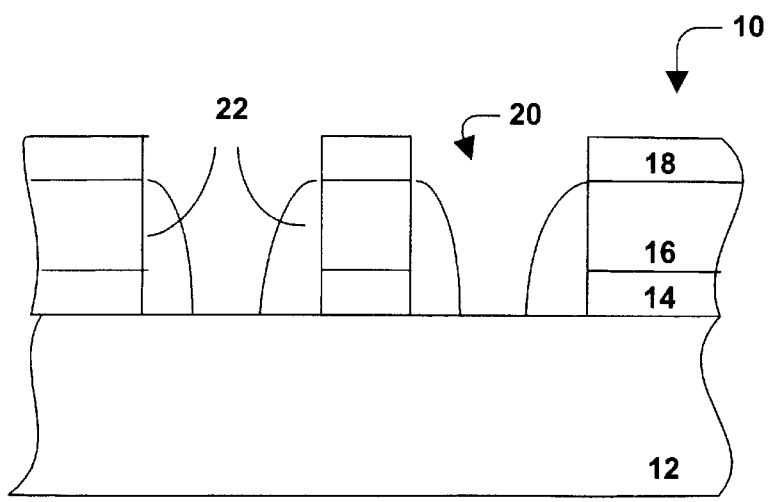

Referring to FIG. 3, polysilicon sidewalls 22 are formed in the openings 20 in any suitable manner, including deposition and etch-back. Polysilicon is deposited in openings 20 using chemical vapor deposition (CVD) techniques, and preferably low pressure chemical vapor deposition (LPCVD) techniques, and silane. The polysilicon may be doped or undoped. A portion of the polysilicon deposited in the openings 20 is removed using dry etch techniques. In a preferred embodiment, the etch is a dry anisotropic process. In another preferred embodiment, a fluorine containing compound and/or chlorine containing compound is used to etch-back a portion of the polysilicon deposited in the openings 20. For example, anisotropic etching involves employing at least one of $BCl_3$, $CCl_4$, $SiCl_4$, $Cl_2$, $NF_3$, $SF_6$, $CH_3F$, $CF_4$ and $CHF_3$. In a preferred embodiment, a portion of the bulk silicon layer 12 is exposed.

The polysilicon sidewalls 22 can be formed to any height and thickness suitable for facilitating heat removal from the silicon device layer of an SOI substrate. The height refers to the distance from the bulk silicon layer 12 to the top of a polysilicon sidewall 22 measured along the sidewall of the buried insulation layer 14 and silicon device layer 16. The thickness refers to the average distance away from the sidewall of the buried insulation layer 14 and silicon device layer 16 that the polysilicon sidewall 22 extends (typically, the thickness near the top of the polysilicon sidewalls 22 is smaller than the thickness near the bottom or near the bulk silicon layer 12 interface of the polysilicon sidewalls). The height and thickness of the polysilicon sidewalls 22 is primarily dependent upon the time the polysilicon etch-back etchant is in contact with the polysilicon in the openings 20.

In one embodiment, generally, the height and thickness of the polysilicon sidewalls 22 is from about 200 Å to about 10,000 Å and from about 10 Å to about 2,000 Å, respectively. In another embodiment, the height and thickness of the polysilicon sidewalls 22 is from about 500 Å to about 7,500 Å and from about 50 Å to about 1,500 Å, respectively. In yet another embodiment, the height and thickness of the polysilicon sidewalls 22 is from about 1,000 Å to about 6,000 Å and from about 100 Å to about 1,000 Å, respectively.

The height of the polysilicon sidewalls 22 preferably reaches the top surface of the silicon device layer 16. However, in one embodiment, the height of the polysilicon sidewalls 22 reaches at least about 25% of the thickness (or vertical height) of the silicon device layer 16. In another embodiment, the height of the polysilicon sidewalls 22 reaches at least about 50% of the thickness of the silicon device layer 16. In yet another embodiment, the height of the polysilicon sidewalls 22 reaches at least about 75% of the thickness of the silicon device layer 16.

Figure 4:
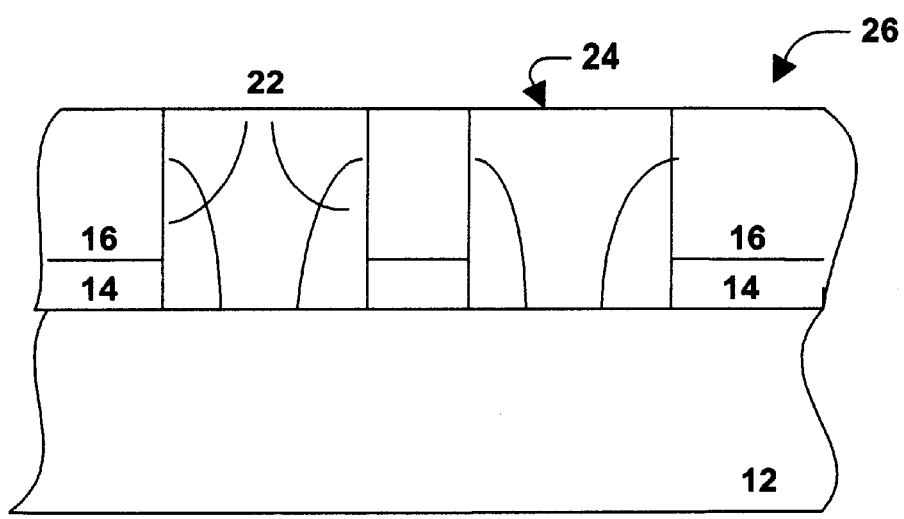
FIG. 4 is a cross-sectional view of one embodiment of an SOI substrate made in accordance with the present invention.

Referring to FIG. 4, an insulation material 24 is formed in the remaining portions of openings 20 and the isolation area mask layer 18 is removed to provide an SOI substrate 26. That is, the gaps between polysilicon sidewalls 22 are filled with an insulating material. In a preferred embodiment, a portion of the insulation material 24 is in contact with the bulk silicon layer 12. The insulation material 24 typically contains silicon dioxide, although the insulation layer may contain any suitable insulating or oxide material. For example, the insulation material 24 may contain at least one of silicon nitride, and silicon oxynitride.

The insulation material 24 is formed using any suitable technique including CVD techniques such as LPCVD and plasma enhanced chemical vapor deposition (PECVD). Excess insulation material 24 is removed with the isolation area mask layer 18 using at least one of etching and chemical mechanical polishing (CMP). CMP techniques are preferred. The insulation material 24 serves to electrically isolate the polysilicon sidewalls 22 and forms isolation areas between portions of the silicon device layer 16.

The polysilicon sidewalls 22 serve to facilitate the transfer of heat away from the silicon device layer 16. Heat removed via the polysilicon sidewalls 22 is dissipated in the bulk silicon layer 12. As a result, the SOI substrate 26 made in accordance with the present invention has good heat removal properties due to the presence of the polysilicon sidewalls 22. In particular, the relatively high thermal conductivity of polysilicon (relative to silicon dioxide) removes heat that may locally accumulate in certain areas (typically near or under devices and/or conductive structures) of the device layer 16 and buried insulation layer 14. The high thermal conductivity of polysilicon also dissipates heat that may locally accumulate in certain areas of the device layer 16 and buried insulation layer 14 (or distributes the heat throughout the bulk silicon layer 12). Improving the removal of heat from the silicon device layer 16 consequently improves the performance and increases the life of devices, such as MOSFETs, formed on the silicon device layer 16 of the SOI substrate 26. In embodiments where the openings 20 are trenches, isolation regions are formed which contribute to the improved performance and reliability of electrical devices formed on the SOI substrate 26.

Although not shown, any heat generating structure may be formed on or within at least the remaining portions of the silicon device layer 16 of the SOI substrate 26. Heat generating structures include active elements and passive elements including polysilicon gates, word lines, source regions, drain regions, ionized regions, bit lines, bases, emitters, collectors, conductive lines, electrical contacts between various structures, etc.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the fiction in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A Silicon-on-Insulator substrate, comprising:
   a bulk silicon layer, a buried insulation layer over the bulk silicon layer, a silicon device layer over the buried insulation layer;
   a plurality of openings in the silicon device layer and the buried insulation layer, wherein each of the plurality of openings contains an undoped polysilicon sidewall adjacent and contacting each of the bulk silicon layer, the buried insulation layer, and the silicon device layer, the undoped polysilicon sidewall surrounding an insulating material, the insulating material directly contacting the bulk silicon layer.

2. The Silicon-on-Insulator substrate of claim 1, wherein the buried insulation layer has thickness from about 100 Å to about 5,000 Å and the silicon device layer has thickness from about 500 Å to about 5,000 Å.

3. The Silicon-on-Insulator substrate of claim 1, wherein the buried insulation layer comprises silicon dioxide and the insulating material comprises at least one of silicon dioxide, silicon nitride, and silicon oxynitride.

4. The Silicon-on-Insulator substrate of claim 1, wherein the undoped polysilicon sidewall has a height and thickness from about 200 Å to about 10,000 Å and from about 10 Å to about 2,000 Å, respectively.

5. The Silicon-on-Insulator substrate of claim 1, wherein the undoped polysilicon sidewall has a height and thickness from about 1,000 Å to about 6,000 Å and from about 100 Å to about 1,000 Å, respectively.

6. The Silicon-on-Insulator substrate of claim 1, further comprising a heat
   generating structure over the silicon device layer.

* * * * *